(12) United States Patent
Kito et al.

(10) Patent No.: US 12,376,275 B2
(45) Date of Patent: Jul. 29, 2025

(54) IMAGE PROCESSING DEVICE, MOUNTING DEVICE, AND IMAGE PROCESSING METHOD

(71) Applicant: FUJI CORPORATION, Chiryu (JP)

(72) Inventors: Shuichiro Kito, Toyota (JP); Takahiro Kobayashi, Chiryu (JP); Kazuya Kotani, Toyota (JP); Yutaka Mizutani, Kaizu (JP)

(73) Assignee: FUJI CORPORATION, Chiryu (JP)

( * ) Notice: Subject to any disclaimer, the term of this patent is extended or adjusted under 35 U.S.C. 154(b) by 352 days.

(21) Appl. No.: 17/904,493

(22) PCT Filed: Feb. 21, 2020

(86) PCT No.: PCT/JP2020/007121
§ 371 (c)(1),
(2) Date: Aug. 18, 2022

(87) PCT Pub. No.: WO2021/166230
PCT Pub. Date: Aug. 26, 2021

(65) Prior Publication Data
US 2023/0108672 A1 Apr. 6, 2023

(51) Int. Cl.
*H05K 13/08* (2006.01)
*G06T 7/00* (2017.01)
(Continued)

(52) U.S. Cl.
CPC ......... *H05K 13/081* (2018.08); *G06T 7/0002* (2013.01); *G06V 10/60* (2022.01); *H05K 13/0419* (2018.08); *G06T 2207/30108* (2013.01)

(58) Field of Classification Search
CPC .. G06V 10/507; G06V 10/60; G06V 2201/06; G06T 7/0002; G06T 7/42;
(Continued)

(56) References Cited

U.S. PATENT DOCUMENTS

2018/0098467 A1\* 4/2018 Nakamura ........... H05K 13/086
2018/0228067 A1\* 8/2018 Chi ........................ H05K 13/08

FOREIGN PATENT DOCUMENTS

EP 3 153 814 A1 4/2017
JP 2011-86970 \* 4/2011
(Continued)

OTHER PUBLICATIONS

International Search Report Issued Apr. 28, 2020, in PCT/JP2020/007121, filed on Feb. 21, 2020, therein, 2 pages.

*Primary Examiner* — Gregory A Morse
*Assistant Examiner* — Stefano Anthony Dardano
(74) *Attorney, Agent, or Firm* — Oblon, McClelland, Maier & Neustadt, L.L.P.

(57) ABSTRACT

An image processing device for processing an image of a tape in which multiple cavities for accommodating a component are provided along a predetermined feeding direction includes a generation section configured to extract brightnesses of pixels of a line along the feeding direction from the image and to generate a brightness waveform of the line, and a recognition section configured to execute a periodic analysis of a brightness change from the brightness waveform and to recognize a pitch of the cavities based on a wavelength obtained by the periodic analysis.

2 Claims, 7 Drawing Sheets

(51) Int. Cl.
*G06V 10/60* (2022.01)
*H05K 13/04* (2006.01)

(58) Field of Classification Search
CPC ...... G06T 2207/30108; G06F 2218/10; H05K 13/0417; H05K 13/0419; H05K 13/081; H05K 13/0812; H05K 13/0813; H05K 13/08; H05K 13/02; H05K 13/085
See application file for complete search history.

(56) References Cited

FOREIGN PATENT DOCUMENTS

| | | |
|---|---|---|
| JP | 2017-130482 A | 7/2017 |
| JP | 2017-220623 A | 12/2017 |

\* cited by examiner

FEEDING DIRECTION

|  | V-Coordinate [μm] | BRIGHTNESS | MAGNITUDE (THRESHOLD 190) |  |
|---|---|---|---|---|
|  | ⋮ | ⋮ | ⋮ |  |
| MP | *** | 118 | SMALLER |  |
| MP | *** | 247 | LARGER | B |
| MP | *** | 120 | SMALLER |  |
| MP | *** | 240 | LARGER | B |
| MP | *** | 101 | SMALLER |  |
|  | ⋮ | ⋮ | ⋮ |  |

IMAGE PROCESSING DEVICE, MOUNTING DEVICE, AND IMAGE PROCESSING METHOD

TECHNICAL FIELD

The present description discloses an image processing device, a mounting device, and an image processing method.

BACKGROUND ART

Conventionally, there have been proposed devices for detecting the pitch of cavities or the like for a tape in which component accommodating cavities are provided (for example, refer to Patent Literature 1). In this device, light is caused to pass through the tape, an amount of transmitted light is detected by a photosensor or the like, and the detected amount of transmitted light is compared with a threshold to thereby detect whether the portion of the tape where the light is caused to pass constitutes an empty cavity without a component or a tape portion.

PATENT LITERATURE

Patent Literature 1: JP-A-2017-220623

BRIEF SUMMARY

Technical Problem

Here, depending on the material or color of the tape, there may be a case in which a change in brightness of the detected amount of transmitted light is small. In this case, with the device described above in which the detection is made by simply comparing the amount of transmitted light with the threshold, there may be a possibility that an erroneous detection is made.

A main object of the present disclosure is to enable an accurate recognition of a pitch of cavities even on a tape whose brightness does not change much.

Solution to Problem

The present disclosure employs the following means in order to achieve the main object described above.

A first image processing device according to the present disclosure is an image processing device for processing an image of a tape in which multiple cavities for accommodating a component are provided along a predetermined feeding direction, and to summarize, the image processing device includes a generation section configured to extract brightnesses of pixels of a line along the feeding direction from the image to generate a brightness waveform of the line, and a recognition section configured to execute a periodic analysis of a brightness change from the brightness waveform to recognize a pitch of the cavities based on a wavelength obtained by the periodic analysis.

The first image processing device according to the present disclosure extracts brightnesses of pixels of the line along the feeding direction from the image of the tape, and generates a brightness waveform of the line. Then, the first image processing device executes the periodic analysis of the brightness change from the brightness waveform and recognizes the pitch of the cavities based on the wavelength obtained by the periodic analysis. As a result, the wavelength can be obtained accurately by the periodic analysis even on the tape in which the brightness of an image does not change much, thereby making it possible to recognize accurately the pitch of the cavities.

DESCRIPTION OF EMBODIMENTS

Next, embodiments of the present disclosure will be described by reference to accompanying drawings.

Figure 1:
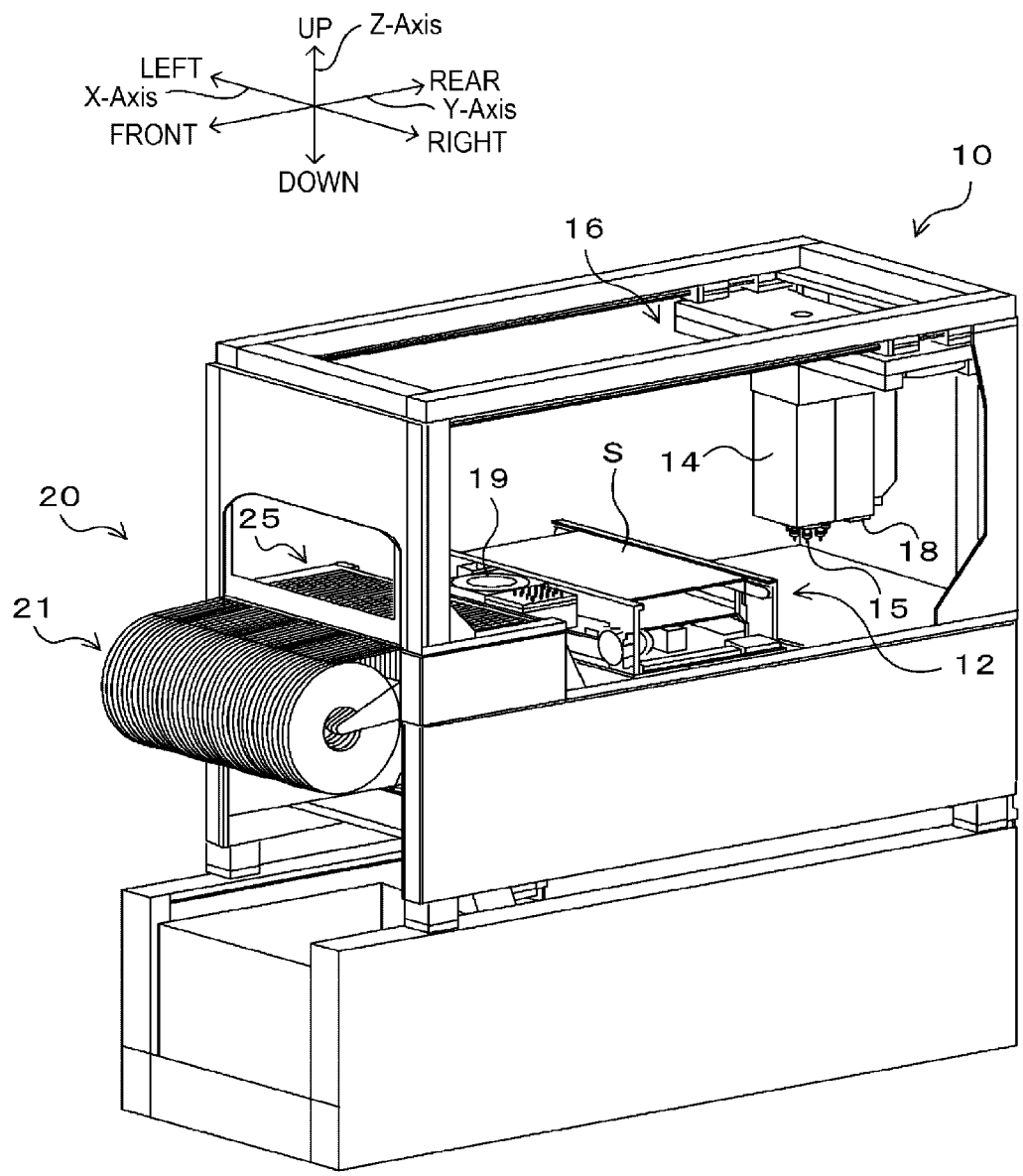
FIG. 1 A schematic diagram showing schematically a configuration of mounting device 10.
Figure 2:
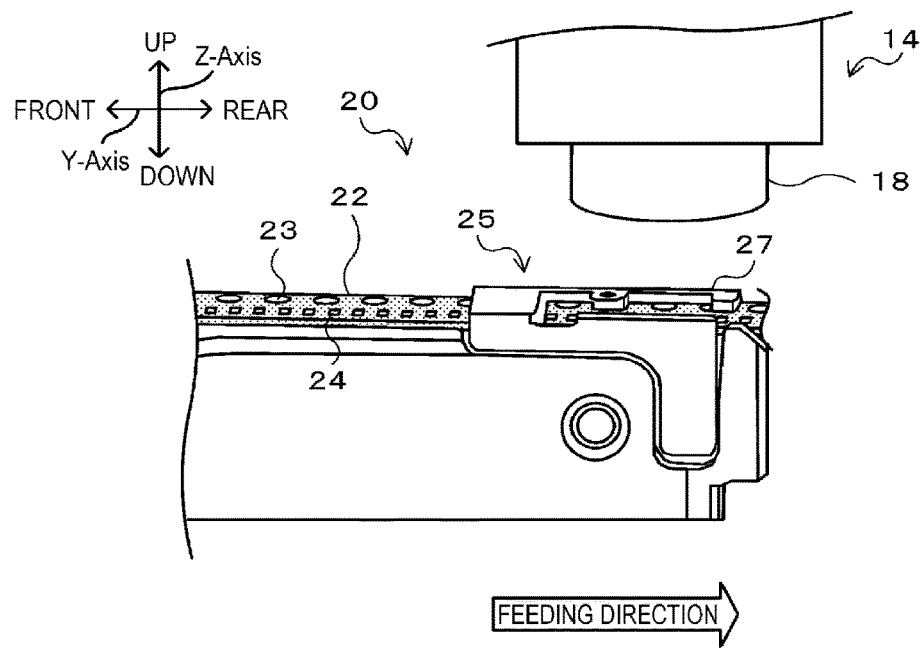
FIG. 2 A perspective view showing schematically feeder section 25 of feeder 20.
Figure 3:
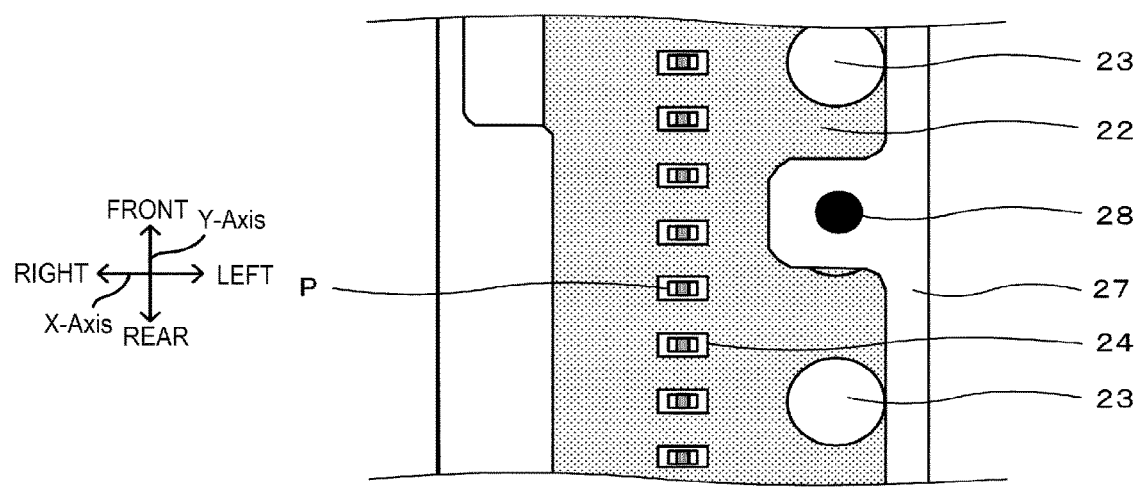
FIG. 3 A top view showing schematically feeder section 25 of feeder 20.
Figure 4:
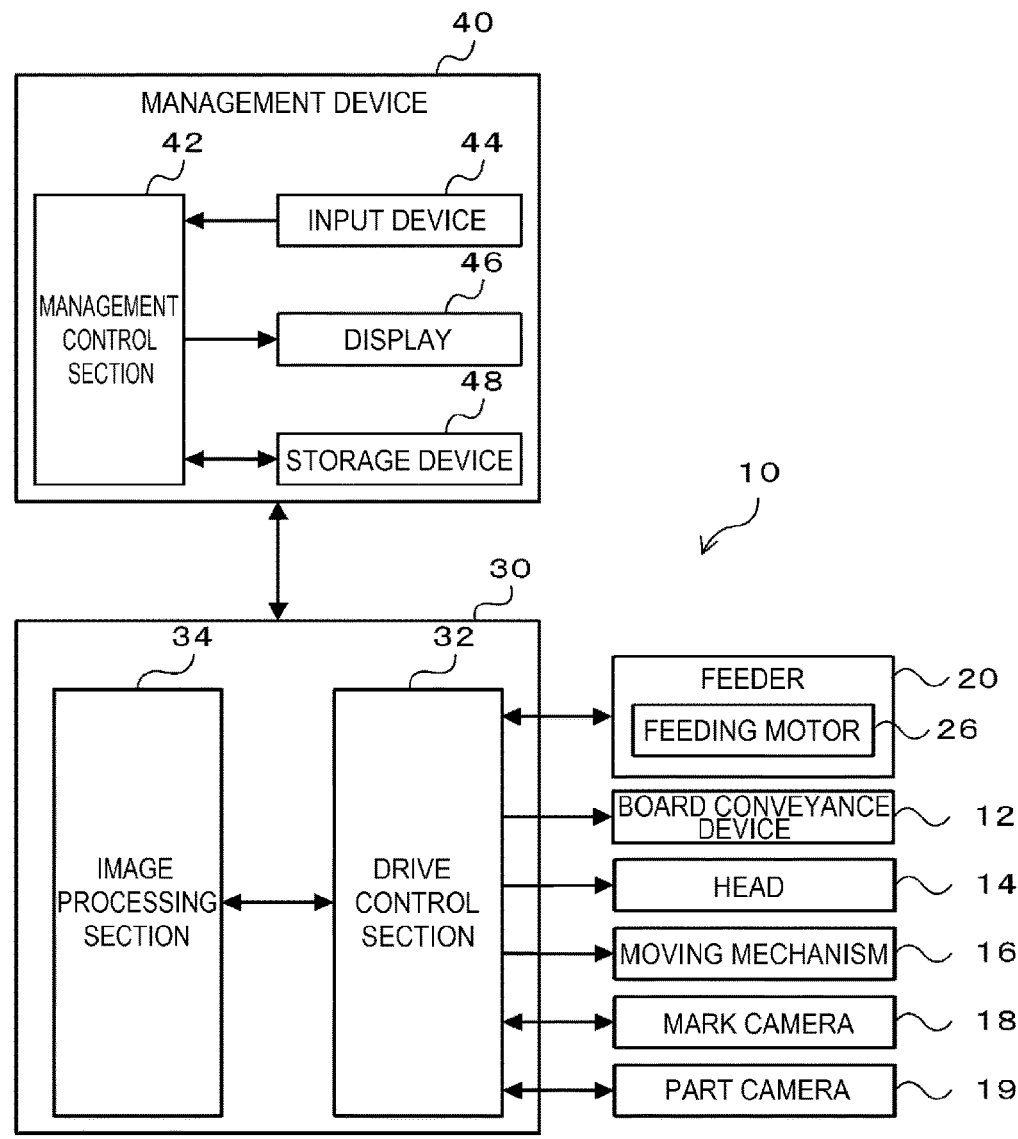
FIG. 4 A block diagram showing a configuration for controlling mounting device 10 and management device 40.

[First Embodiment] FIG. 1 is a schematic diagram showing schematically a configuration of mounting device 10. FIG. 2 is a perspective view showing schematically feeder section 25 of feeder 20. FIG. 3 is a top view showing schematically feeder section 25 of feeder 20. FIG. 4 is a block diagram showing a configuration for controlling mounting device 10. In the present embodiment, in FIG. 1, a left-right direction is an X-axis direction, a front-rear direction is a Y-axis direction, and an up-down direction is a Z-axis direction.

As shown in FIG. 1, mounting device 10 includes feeder 20 for supplying components P accommodated in a tape, board conveyance device 12 for conveying board S having a flat plate-like shape, head 14 for picking up component P with suction nozzle 15 to mount it on board S, and moving mechanism 16 for moving head 14 in XY directions. In addition, mounting device 10 includes mark camera 18 for imaging various marks affixed to board S, an upper surface of tape of the feeder 20, and the like, part camera 19 for imaging component P picked up and held by suction nozzle 15 from below, and control device 30 (refer to FIG. 4) for governing the control of the whole of mounting device 10. Head 14 has one or multiple suction nozzles 15, and these suction nozzles 15 are raised and lowered in the up-down direction by a Z-axis motor, not shown.

Feeder 20 includes reel section 21 including a reel around which tape 22 (refer to FIG. 2) is wound and feeder section 25 for drawing and feeding tape 22 from reel section 21, and is detachably attached to mounting device 10. Feeder section 25 includes feeding motor 26 (refer to FIG. 4) such as a stepping motor for rotating a sprocket, not shown. Tape 22 has multiple concaved cavities 24 for accommodating component P which are formed along a feeding direction (a longitudinal direction) of tape 22. In addition, tape 22 has feeding holes 23 with which sprocket teeth, which are formed on an outer circumference of a sprocket of feeder section 25, are brought into engagement. Feeder 20 drives feeding motor 26 of feeder section 25 to intermittently rotate the sprocket to thereby intermittently feed tape 22 by a predetermined amount to the rear in a Y-direction (feeding direction), so that component P is supplied to a component supply position where head 14 (suction nozzle 15) can pick up relevant component P. Feeder section 25 includes guide frame 27 for guiding the movement of tape 22. Guide frame 27 is provided so as to extend on both left and right sides of feeder 20 along the front-rear direction with a part thereof straddling tape 22 thereabove. Fiducial mark 28, serving as a reference position, is formed on this guide frame 27. Although circular fiducial mark 28 is shown here, any shape can be used as long as the reference position can be recognized. Mounting device 10 can obtain, for example, a positional deviation amount of tape 22 when tape 22 is fed based on a positional relationship between feeding hole 23 of tape 22 and fiducial mark 28. Although not shown, feeder 20 includes a control section made up of CPU, ROM, RAM, and the like. When attached to mounting device 10, feeder 20 is connected in such a manner that the control section can communicate with control device 30.

Here, multiple cavities 24 are formed in tape 22 along the feeding direction at any certain pitch of multiple pitches. The multiple pitches are, for example, 1 mm, 2 mm, 4 mm, 8 mm, and the like, and multiple cavities 24 are formed at any one of these pitches in accordance with a size of component P to be accommodated therein. In addition, feeder 20 can sequentially supply components P in cavities 24 to the component supply position by intermittently feeding tape 22 by an amount corresponding to the pitch of cavities 24 as a predetermined feeding amount of tape 22. Tape 22 is formed so that one cavity 24 is located to a side (a right side in FIG. 3) of a center position of feeding hole 23.

Control device 30 includes CPU, ROM, RAM, HDD, and the like, which are not shown. As shown in FIG. 3, control device 30 includes, as functional blocks, drive control section 32 for driving individual sections, and image processing section 34 for processing images captured by mark camera 18 and part camera 19. Drive control section 32 outputs control signals to feeder 20, board conveyance device 12, head 14, moving mechanism 16, mark camera 18, part camera 19, and the like. Various pieces of information on component P from the control section of feeder 20, an image signal from mark camera 18, an image signal from part camera 19, and the like are input into drive control section 32. Image signals from mark camera 18 and part camera 19 are processed at image processing section 34. Image signals may be input directly into image processing section 34. In addition, control device 30 is connected with management device 40 for managing information on a mounting process so as to enable a bidirectional communication therebetween via a communication network, whereby control device 30 and management device 40 exchange data and control signals therebetween.

Management device 40 is a general-purpose computer, and includes, as shown in FIG. 4, management control section 42, input device 44 such as a keyboard and a mouse, display 46, and storage device 48 such as HDD or SSD. Management control section 42 is made up of CPU, ROM, RAM, and the like, and receives input signals from input device 44 while outputting image signals to display 46. Storage device 48 stores a production plan of board S. The production plan of board S is a plan that defines mounting positions and mounting orders of components P on a mounting surface of board S in mounting device 10, a production number of boards S on which components P are so mounted, and the like. Management device 40 outputs a command signal to control device 30 so that components P are mounted in accordance with the production plan.

Figure 5:
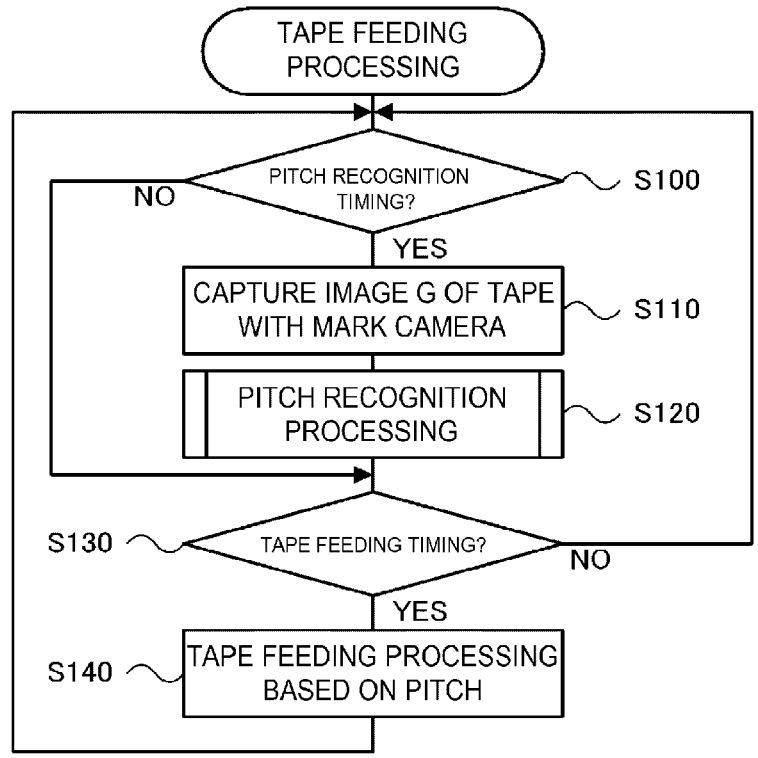
FIG. 5 A flowchart showing an example of processing for feeding a tape.

The operation of mounting device 10 that is configured as has been described heretofore will be described as below. Here, processing for feeding tape 22 of feeder 20 will be described. FIG. 5 is a flowchart showing an example of processing for feeding the tape. This processing is executed by the functions of drive control section 32 and image processing section 34.

Figure 6:
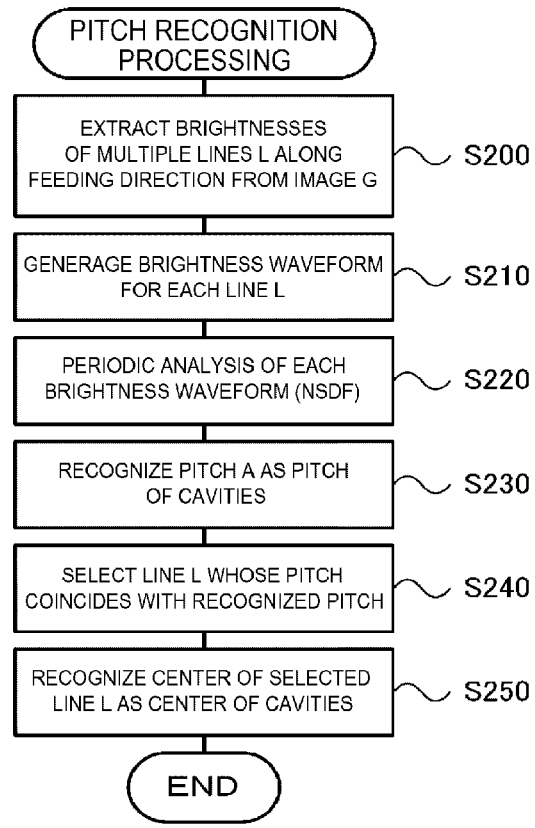
FIG. 6 A flowchart showing an example of pitch recognition processing.

In the tape feeding processing, control device 30 first determines whether now is a timing at which the pitch of cavities 24 of tape 22 is recognized (S100). Control device 30 determines that it is the pitch recognition timing then, for example, when new feeder 20 is attached to mounting device 10. In addition, control device 30 also determines that it is the pitch recognition timing, for example, when splicing work is performed in which a starting end of new tape 22 is joined to a terminal end of tape 22 in which a component shortage is about to occur and that new tape 22 is fed to the vicinity of the component supply position. If control device 30 determines that it is the pitch recognition timing now, control device 30 executes pitch recognition processing in which control device 30 causes mark camera 18 to capture image G of tape 22 from above (S110, refer to FIG. 2), and causes that captured image G to be processed so as to recognize a pitch of cavities 24 (S120). FIG. 6 is a flowchart showing an example of the pitch recognition processing. The pitch recognition processing is executed by image processing section 34.

Figure 7:
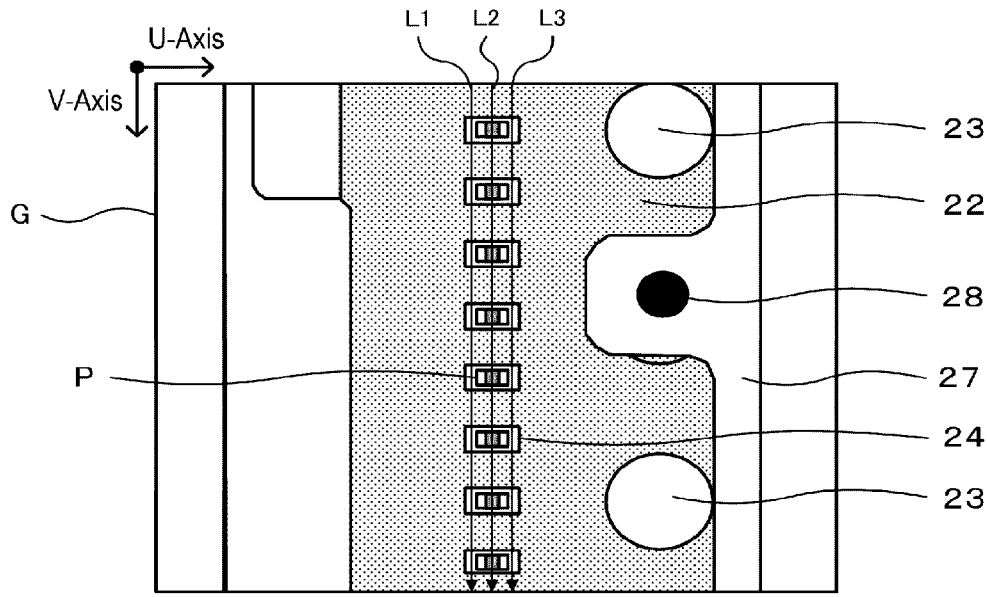
FIG. 7 An explanatory diagram showing an example of multiple lines L in image G.

In the pitch recognition processing, image processing section 34 extracts brightnesses of pixels of multiple lines L extending along the feeding direction (front-rear direction) of tape 22 from that image G captured in S110 (S200). FIG. 7 is an explanatory diagram showing an example of multiple lines L in image G. Multiple lines L only need be set at, for example, of an interval of a predetermined number of pixels in the left-right direction. Positions of pixels in image G are indicated by UV coordinates. A U-axis corresponds to an X-axis direction, and a V-axis corresponds to a Y-axis direction.

Figure 8:
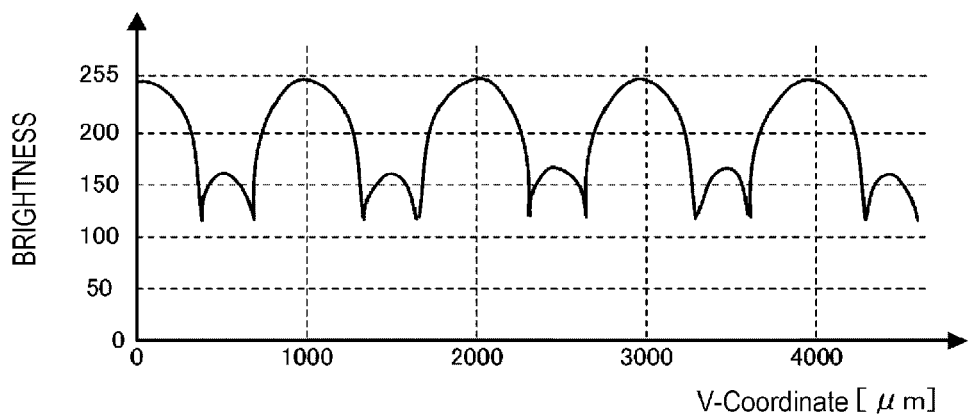
FIG. 8 An explanatory diagram showing an example of a brightness waveform in line L.

Subsequently, image processing section 34 generates a brightness waveform indicating a brightness change in the tape feeding direction for each line L based on the extracted brightness (S210). FIG. 8 is an explanatory diagram showing an example of a brightness waveform in line L. In FIG. 8, an axis of abscissa represents a coordinate of the V-axis which corresponds to the tape feeding direction, and an axis of ordinate represents brightness. In this brightness waveform, a relatively large peak close to a value in brightness of 255 is generated every about 1000 μm, and a relatively small peak close to a value in brightness of 160 to 170 is generated between the relatively large peaks. The degree of reflection of light changes depending on the materials of tape 22 and components P in cavities 24, whether the surfaces of tape 22 and components P are glossy, the colors thereof, and the like, and hence, the waveform indicating the brightness change in line L defers depending on the types of tape 22 and components P.

Subsequently, image processing section 34 executes a periodic analysis of the brightness waveform (S220). Here, as described above, cavities 24 are provided at any certain pitch in the multiple pitches. As a result, a brightness change of line L which overlaps a row of cavities 24 constitutes a periodic waveform whose wavelength corresponds to the pitch of cavities 24 in terms of length. On the other hand, a brightness change of lines L which do not overlap the row of cavities 24 does not constitute such a periodic waveform. In the present embodiment, the periodic analysis of a brightness waveform is executed using a function or an analysis method for evaluating such periodicity. As an example, image processing section 34 employs the Normalized Square Difference Function (NSDF). The normalized squared difference function is defined by Equation 1.

[Equation 1]

$$n'(\tau) = 1 - \frac{m'(\tau) - 2r'(\tau)}{m'(\tau)} \quad (1)$$
$$= \frac{2r'(\tau)}{m'(\tau)}$$

In Equation 1, n'(τ) is a normalized square difference function in a delay τ and indicates that the larger the value of n'(τ), the stronger the periodicity of a brightness change. r'(τ) is an autocorrelation function (ACF) defined by Equation 2. m'(τ) is a squared difference function (SDF) defined by Equation 3. W is an initial value of a size of a window for waveform analysis, and V is a V-direction of an image, that is, a Y-direction which is the tape feeding direction. In the normalized square difference function, the periodicity is evaluated by detecting a peak having a high correlation while shifting the brightness waveform in the V-direction; however, since it is described in the international application (International Application No. PCT/JP2014/065043) filed by the applicant or the like, a detailed description thereof will be omitted.

[Equation 2]

$$r'(\tau) = \sum_{j=0}^{W-1-\tau} V_j V_{j+\tau} \quad (2)$$

$$m'(\tau) = \sum_{j=0}^{W-1-\tau} \left(V_j^2 + V_{j+\tau}^2\right) \quad (3)$$

Figure 9:
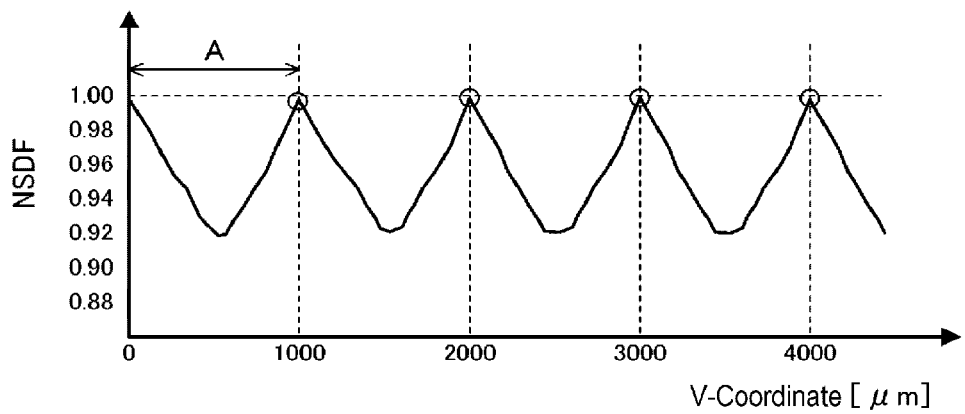
FIG. 9 An explanatory diagram showing an example of a waveform calculated by a normalized square difference function.

Image processing section 34 recognizes pitch A (wavelength) of the peak obtained in the periodic analysis in S220 as the pitch of cavities 24 (S230). Here, FIG. 9 is an explanatory diagram showing an example of a waveform calculated using the normalized square difference function. The normalized square difference function has a characteristic that a wavelength having a high correlation becomes close to a value of 1.0, and multiple peaks (refer to circles in FIG. 9) appear at around the value of 1.0. Image processing section 34 can obtain pitch A from a pixel value of a position where each peak occurs and the resolution of mark camera 18. FIG. 9 illustrates a case where pitch A is about 1000 μm. In this case, image processing section 34 recognizes in S230 that the pitch of cavities 24 is 0.1 mm. In addition, in FIG. 9, relatively small peaks generated in FIG. 8 and the like are eliminated, and hence, image processing section 34 can recognize the pitch of cavities 24 accurately.

Figure 10:
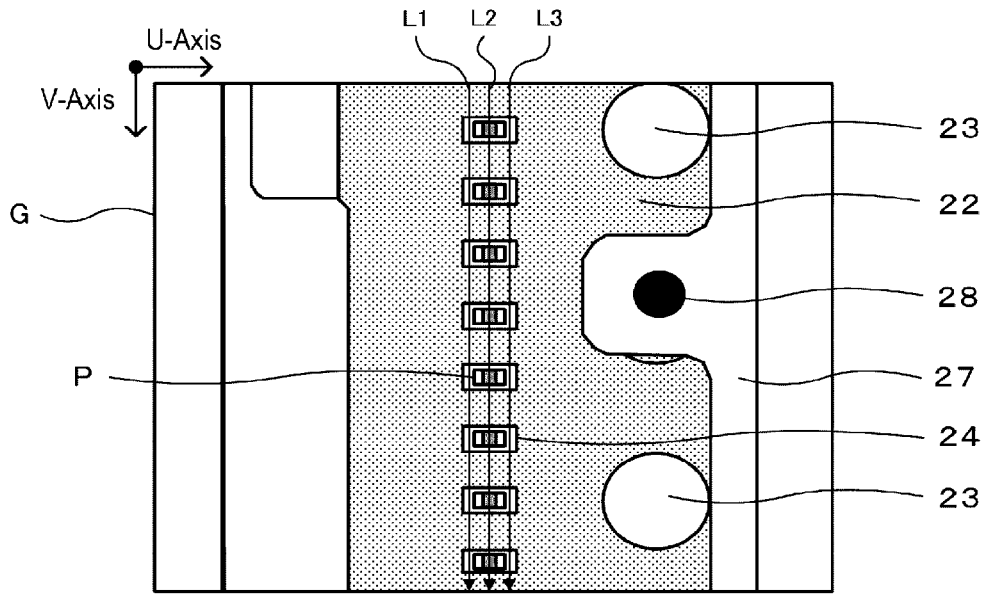
FIG. 10 An explanatory diagram showing an example of how to recognize a center of cavity 24.

Subsequently, image processing section 34 selects in multiple lines L line L whose analysis result in S220 matches the pitch recognized in S230 (S240). Then, image processing section 34 recognizes a center in the left-right direction (the U-axis direction, the X-axis direction) of selected line L as a center of cavity 24 (S250), and ends the pitch recognition processing. FIG. 10 is an explanatory diagram showing an example of how to recognize a center of cavity 24. As shown therein, for example, three lines L1 to L3 are selected in multiple lines L. Since the number of selected lines L is an odd number, image processing section 34 recognizes center line L2 as a center of cavity 24. If the number of selected lines L is an even number, a center position between lines L at both ends in the U-axis direction is recognized as a center of cavity 24, whereas if the number of selected lines L is a value of 1, that line L so selected is recognized as a center of cavity 24.

In the tape feeding processing in FIG. 5, if control device 30 executes the pitch recognition processing in S120 (FIG. 6) or determines in S100 that it is not the pitch recognition timing then, control device 30 determines whether it is a timing for feeding tape 22 then (S130). Control device 30 determines that it is the tape feeding timing then if suction nozzle 15 of head 14 is not in a component pickup operation but is ready for feeding subsequent component P to the component supply position. If control device 30 determines that it is the tape feeding timing then, control device 30 executes tape feeding processing of feeding tape 22 based on the pitch recognized in S120 (S140) and returns to S100. In contrast, if control device 30 determines in S130 that it is not the tape feeding timing then, control device 30 skips S140 to return to S100. Since control device 30 executes the tape feeding processing based on the pitch recognized in the pitch recognition processing, control device 30 can move cavities 24 correctly to the component supply position, so that components P can be supplied thereto as required. In addition, control device 30 can cause components P to be picked up more stably in the component supply position by minutely adjusting a pickup position of suction nozzle 15 in the left-right direction based on the center of cavity 24 recognized as described above.

Here, in the case that the tape feeding processing is executed based on a pitch inputted by the operator via, for example, management device 40 or an operation panel, not shown, there may be a possibility that tape 22 is fed at an erroneous pitch due to an erroneous recognition or an erroneous input by the operator. If tape 22 is fed at a pitch smaller than the actual pitch, there may be a possibility that a pickup error of suction nozzle 15 occurs frequently. On the contrary, if tape 22 is fed at a pitch larger than the actual pitch, there may be a possibility that component P passes the component supply position without being picked up thereat to thereby be discarded. With the present embodiment, since the pitch is recognized correctly through the pitch recognition processing, the pickup error or discarding of component P which is described above can be prevented.

Here, correspondences between constituent elements of the present embodiment and constituent elements of the present disclosure will be clarified. Image processing section 34 of the present embodiment corresponds to an image processing device of the present disclosure, cavity 24 corresponds to a cavity, tape 22 corresponds to a tape, image processing section 34 that executes S200 and S210 of the pitch recognition processing in FIG. 6 corresponds to a generation section, and image processing section 34 that executes S220, S230 of the pitch recognition processing corresponds to a recognition section. In addition, feeder 20 corresponds to a feeder, mounting device 10 corresponds to a mounting device, mark camera 18 corresponds to an imaging device, and drive control section 32 corresponds to a control device. The present embodiment also clarifies an example of an image processing method of the present disclosure by describing the operation of mounting device 10.

With mounting device 10 that has been described heretofore, image processing section 34 extracts the brightnesses of the pixels of line L along the feeding direction of tape 22 from image G to thereby generate a brightness waveform. Then, pitch A (wavelength) of the peaks obtained through the periodic analysis is recognized as the pitch of cavities 24. As a result, even with tape 22 or the like in which the brightness change of image G is small, the pitch of cavities 24 can accurately be recognized. In addition, since mounting device 10 executes the tape feeding processing based on the pitch so recognized, cavities 24 can be moved correctly to the component supply position so that components P can be picked up as required.

In addition, image processing section 34 selects in multiple lines L line L in which the result of the periodic analysis corresponds to the recognized pitch, and recognizes the center of line L so selected as the center of cavity 24. As a result, even with tape 22 in which the brightness change of image G is small, the center of cavity 24 in the orthogonal direction orthogonal to the feeding direction can accurately be recognized.

With image processing section 34, since the periodic analysis is executed using the normalized square difference function, the peaks of high correlation can be detected more easily by suppressing the influence of noise than when a periodic analysis is executed using the Fourier transform or the like, the pitch of cavities 24 can be recognized more accurately.

Needless to say, the present disclosure is not limited to the embodiment that has been described heretofore in any way, and hence, the present disclosure can be carried out in various aspects without departing from the technical scope of the present disclosure.

For example, in the embodiment that has been described heretofore, the periodic analysis is described as being executed employing the normalized square difference function; however, the present disclosure is not limited thereto, and hence, any type of analysis processing may be adopted as long as the periodicity of brightness change is analyzed. For example, the average amplitude difference function or the Fourier transform may be used. The average amplitude difference function is described in the international application (International Application No. PCT/JP2014/065043) by the applicant.

In the embodiment that has been described heretofore, not only the pitch of cavities 24 but also the center of cavity 24 is recognized; however, the present disclosure is not limited thereto, and hence, the pitch of cavities 24 may be recognized without recognizing the center of cavity 24. In such a case, multiple lines L do not always have to be analyzed, but only one line L in multiple lines L may be analyzed.

Figure 11:
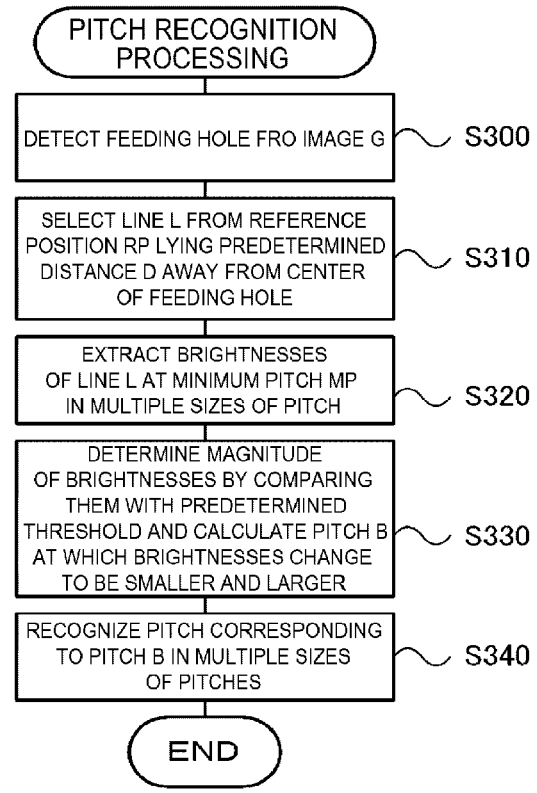
FIG. 11 A flowchart showing an example of pitch recognition processing according to a second embodiment.
Figures 12, 13:
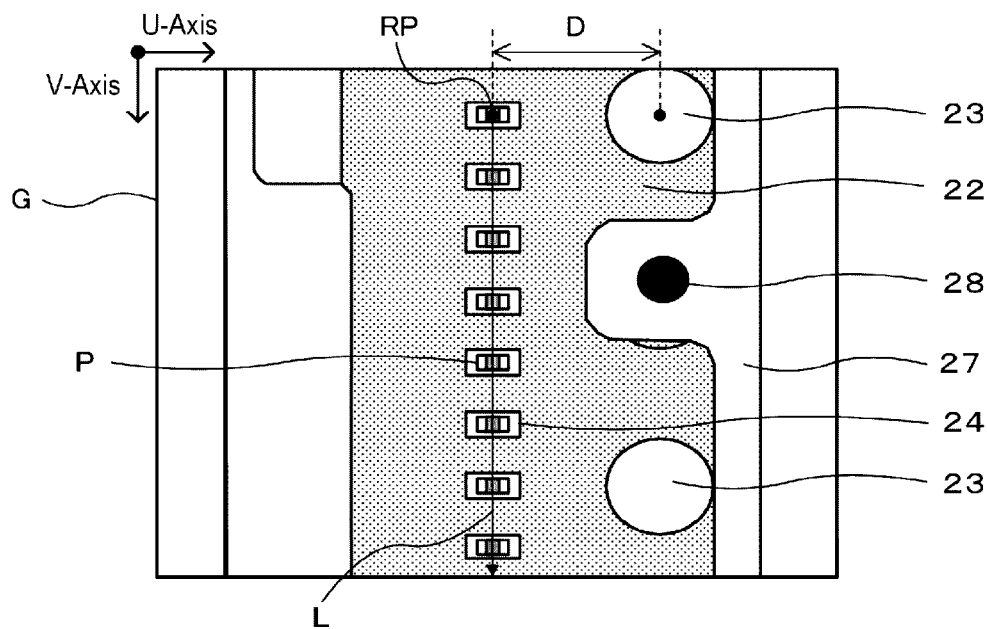
FIG. 12 An explanatory diagram showing an example of line L according to the second embodiment.
FIG. 13 An explanatory diagram showing an example of pitch B at which brightness changes to be smaller and larger.

[Second embodiment] Next, a second embodiment will be described. In the second embodiment, pitch recognition processing of cavities 24 differs from that of the first embodiment. FIG. 11 is a flowchart showing an example of pitch recognition processing according to the second embodiment, and FIG. 12 is an explanatory diagram showing an example of line L according to the second embodiment. In the pitch recognition processing of the second embodiment, image processing section 34 first detects feeding hole 23 from image G (S 300). Next, image processing section 34 defines a position lying predetermined distance D away from a center position of feeding hole 23 so detected in a leftward direction (a U-axis direction) in image G as predetermined reference position RP and then sets line L based on reference position RP so defined (S310). As in the case of the first embodiment, line L extends along the feeding direction of tape 22. Predetermined distance D corresponds to a distance defined between the center of feeding hole 23 and a center of cavity 24. Subsequently, image processing section 34 extracts a brightness of each pixel of line L at minimum pitch MP in multiple pitches (320). For example, as described above, in the case that there are, as the multiple pitches, pitches of 1 mm, 2 mm, 4 mm, 8 mm, and the like, minimum pitch MP is 1 mm. In this case, image processing section 34 extracts brightnesses of the pixels at the pitch of 1 mm in S320. In addition, since cavity 24 is located sideways of the center position of feeding hole 23 as described above, image processing section 34 extracts brightnesses of the pixels at minimum pitch MP based on the position of cavity 24 as reference position RP.

If image processing section 34 extracts brightnesses of the pixels of line L at minimum pitch MP, image processing section 34 determines whether the brightnesses so extracted are smaller or larger than a predetermined threshold by comparing individually the brightnesses with the predetermined threshold to thereby calculate pitch B at which the brightnesses change to be smaller and larger than the threshold (S330). FIG. 13 is an explanatory diagram showing an example of pitch B at which the brightnesses change to be smaller and larger than the predetermined threshold. FIG. 13 shows a state in which the brightnesses so extracted are determined to be smaller or larger than the predetermined threshold (for example, a value of 190) by being compared individually therewith to thereby show that the brightnesses change alternately to be smaller, larger, smaller, larger than the predetermined threshold. That is, in this example, pitch B at which the brightnesses change to be smaller and larger in the way described above becomes twice minimum pitch MP. Then, image processing section 34 recognizes the pitch in the multiple sizes of pitches which corresponds to pitch B at which the brightnesses change to be smaller and larger as a pitch of cavities 24 (S340), and ends the pitch recognition processing. In the example shown in FIG. 13, image processing section 34 determines that the pitch of cavities 24 is the pitch of 2 mm, which is twice minimum pitch MP. There is a case in which a pitch of a recognition target is not an integral multiple of minimum pitch MP as, for example, in the case that minimum pitch MP is 2 mm, while the pitch of the recognition target is 3 mm. Even in that case, since pitch B appears at a common multiple of minimum pitch MP and the pitch of the recognition target, image processing section 34 can recognize the pitch of cavities 24.

In this way, with the second embodiment, image processing section 34 obtains pitch B at which the brightnesses extracted from line L at minimum pitch MP change to be smaller and larger based on the comparison of the brightnesses with the predetermined threshold and recognizes the pitch in the multiple pitches which corresponds to pitch B so obtained as the pitch of cavities 24. As a result, for tape 22 in which the brightness change of image G is small, the pitch of cavities 24 can be recognized more accurately than when the pitch is simply recognized based on the magnitudes of the brightnesses. In addition, as in the case of the first embodiment, with control device 30, since tape 22 is fed based on the recognized pitch, individual cavities 24 can be moved correctly as far as the component supply position for components P to be supplied thereto as required.

Image processing section 34 may be configured so as to execute both the pitch recognition processing of the first embodiment and the pitch recognition processing of the second embodiment. In the case that image processing section 34 is so configured, image processing section 34 may execute both the pitch recognition processings, may execute either of the pitch recognition processings according to a selecting instruction from the operator or the like, or may execute a more appropriate pitch recognition processing depending on the type of tape 22 or component P.

Here, the image processing device of the present disclosure may be configured as follows. For example, in a first image processing device of the present disclosure, the generation section may be configured to generate the brightness waveform for each of multiple lines that are aligned in parallel in an orthogonal direction orthogonal to the feeding direction, and the recognition section may be configured to select one or more lines in the multiple lines in which the result of the periodic analysis corresponds to the recognized pitch and to recognize a center of the one or more lines so selected in the orthogonal direction as a center of the cavity in the orthogonal direction. As a result, the center of the cavity can accurately be recognized even with a tape in which the brightness change of the image is small.

In the first image processing device according to the present disclosure, the recognition section may be configured to execute the periodic analysis employing the normalized square difference function. As a result, since a peak of a high correlation can be detected more easily by suppressing the influence of noise than a case in which the periodic analysis is executed employing the Fourier transform or the like, a pitch of the cavities can be recognized more accurately.

A second image processing device according to the present disclosure is an image processing device for processing an image of a tape in which component accommodating cavities are provided along a predetermined feeding direction at any certain pitch in multiple pitches, and to summarize, the second image processing device includes:

an extraction section configured to extract brightnesses of pixels of a line along the feeding direction from the image from a predetermined reference position in the feeding direction at a minimum pitch in the multiple pitches; and a recognition section configured to obtain a pitch at which the brightnesses change to be smaller and larger based on a comparison of the brightnesses with a predetermined threshold and to recognize a pitch in the multiple pitches which corresponds to the pitch so obtained as a pitch of the cavities.

The second image processing device of the present disclosure extracts the brightnesses of the pixels of the line along the feeding direction from the image of the tape from the predetermined reference position in the feeding direction at the minimum pitch in the multiple pitches. Then, the second image processing device obtains the pitch at which the brightnesses change to be smaller and larger based on the comparison of the brightnesses with the predetermined threshold and recognizes the pitch in the multiple pitches which corresponds to the pitch so obtained as the pitch of the cavities. As a result, for a tape whose brightness changes small, with the second image processing device, the pitch of the cavities can be recognized more accurately than a case in which the pitch is recognized simply from a change in magnitude of the brightness.

A mounting device according to the present disclosure is a mounting device including a feeder attached thereto for feeding the tape and configured to mount the component supplied from the cavity in the tape, the mounting device including:

an imaging device configured to capture an image of the tape;

any one of the image processing devices described above; and a control device configured to cause the feeder to feed the tape based on a pitch of the cavities which is recognized by the image processing device.

Since the mounting device of the present disclosure causes the feeder to feed the tape based on the pitch of the cavities which is recognized by any one of the image processing devices described above, even for a tape whose brightness change is small, with the mounting device, the pitch of the cavities can be recognized accurately so as to feed the tape correctly. As a result, a reduction in productivity can be prevented by preventing the occurrence of a supply error of a component due to an excessive or insufficient feeding amount of the tape or a pickup error of a supplied component.

A first image processing method according to the present disclosure is an image processing method for processing an image of a tape in which multiple cavities for accommodating a component are provided along a predetermined feeding direction, including:

(a) a step of extracting brightnesses of pixels of a line along the feeding direction from the image and generating a brightness waveform of the line; and (b) a step of executing a periodic analysis of a brightness change from the brightness waveform and recognizing a pitch of the cavities based on a wavelength obtained by the periodic analysis.

In the first image processing method of the present disclosure, as with the first image processing device described above, even for a tape whose brightness change is small, since the wavelength can be obtained relatively accurately by the periodic analysis, the pitch of the cavities can be recognized accurately. In the first image processing method, various aspects of the first image processing device described above may be adopted, or steps for realizing the functions of the first image processing device described above may be added.

A second image processing method according to the present disclosure is an image processing method for processing an image of a tape in which component accommodating cavities are provided along a predetermined feeding direction at any certain pitch in multiple pitches, and to summarize, the second image processing method includes:

(a) a step of extracting brightnesses of pixels of a line along the feeding direction from the image from a predetermined reference position in the feeding direction at a minimum pitch in the multiple pitches; and (b) a step of obtaining a pitch at which the brightnesses change to be smaller and larger based on a comparison of the brightnesses with a predetermined threshold and recognizing a pitch in the multiple pitches which corresponds to the pitch so obtained as a pitch of the cavities.

With the second image processing method of the present disclosure, as with the second image processing device described above, for a tape whose brightness changes small, the pitch of the cavities can be recognized more accurately than a case in which the pitch is recognized simply from a change in magnitude of the brightness.

INDUSTRIAL APPLICABILITY

The present disclosure can be applied to a feeder for feeding components accommodated in a tape, a mounting device for mounting components supplied from the feeder on a board, and the like.

REFERENCE SIGNS LIST 10 mounting device, 12 board conveyance device, 14 head, 15 suction nozzle, 16 moving mechanism, 18 mark camera, 19 part camera, 20 feeder, 21 reel section, 22 tape, 23 feeding hole, 24 cavity, 25 feeder section, 26 feeding motor, 27 guide frame, 28 fiducial mark, 30 control device, 32 drive control section, 34 image processing section, 40 management device, 42 management control section, 44 input device, 46 display, 48 storage device, D predetermined distance, G image, L, L1-L3 line, P component, RP reference position, S board

The invention claimed is:

1. An image processing device for processing an image of a tape in which cavities containing components are provided along a feeding direction, comprising:
   processing circuitry configured to:
   detect a feeding hole of the tape from the image;
   define a predetermined reference position as being a predetermined distance from a center of the feeding hole;
   extract brightnesses of pixels of a line along the feeding direction from the image from the predetermined reference position in the feeding direction at a minimum pitch; and
   calculate a pitch of the cavities containing components as a pitch at which a brightness alternatively changes between smaller and larger based on a comparison of the brightnesses with a predetermined threshold.

2. An image processing method for processing an image of a tape in which cavities containing components are provided along a predetermined feeding direction, comprising:
   (a) a step of detecting a feeding hole of the tape from the image;
   (b) a step of defining a predetermined reference position being a predetermined distance from a center of the feeding hole;
   (c) a step of extracting brightnesses of pixels of a line along the feeding direction from the image from the predetermined reference position in the feeding direction at a minimum pitch;
   (d) a step of calculating a pitch of the cavities containing components as a pitch at which a brightness alternatively changes between smaller and larger based on a comparison of the brightnesses with a predetermined threshold.

* * * * *